US008332448B2

(12) United States Patent
Kondo

(10) Patent No.: US 8,332,448 B2
(45) Date of Patent: Dec. 11, 2012

(54) SEMICONDUCTOR INTEGRATED CIRCUIT HAVING A RANDOM NUMBER AND OSCILLATOR CIRCUIT FOR VARIABLY CONTROLLING STORED DATA

(75) Inventor: Hideo Kondo, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 1020 days.

(21) Appl. No.: 12/248,511

(22) Filed: Oct. 9, 2008

(65) Prior Publication Data

US 2009/0100117 A1    Apr. 16, 2009

(30) Foreign Application Priority Data

Oct. 12, 2007   (JP) ................. 2007-266859

(51) Int. Cl.
G06F 7/48   (2006.01)
(52) U.S. Cl. .......... 708/250; 708/251; 708/190; 331/16; 323/283; 323/317
(58) Field of Classification Search .......... 708/251, 708/250; 331/16; 323/283, 317
See application file for complete search history.

(56) References Cited

U.S. PATENT DOCUMENTS

| 5,825,888 | A | 10/1998 | Kimura et al. |
| 5,961,577 | A * | 10/1999 | Soenen et al. ................. 708/251 |
| 6,832,231 | B1 | 12/2004 | Jiang et al. |
| 6,886,023 | B2 | 4/2005 | Lundberg |
| 7,148,755 | B2 * | 12/2006 | Naffziger et al. ................ 331/16 |
| 7,653,855 | B2 | 1/2010 | Yasuda et al. |
| 7,868,604 | B2 * | 1/2011 | Tran et al. ..................... 323/317 |
| 7,956,920 | B2 | 6/2011 | Shimono et al. |
| 8,032,574 | B2 | 10/2011 | Yamamoto et al. |
| 2007/0067375 | A1 | 3/2007 | Inaoka et al. |
| 2007/0210776 | A1 | 9/2007 | Oka |
| 2009/0100119 | A1 | 4/2009 | Kondo |

FOREIGN PATENT DOCUMENTS

| JP | 2003-153526 | 5/2003 |
| JP | 2003-196081 | 7/2003 |

OTHER PUBLICATIONS

Kondo, U.S. Office Action mailed Mar. 28, 2012, directed to U.S. Appl. No. 12/248,551; 7 pages.

* cited by examiner

Primary Examiner — Tammara Peyton
(74) Attorney, Agent, or Firm — Morrison & Foerster LLP

(57) ABSTRACT

The invention reduces unnecessary electromagnetic radiation noise due to an operation clock signal generated by an oscillator circuit. Random number data outputted by a random number generation circuit is stored in a frequency variable data register. The data stored in the frequency variable data register is replaced by random number data sequentially generated by the random number generation circuit. An oscillator circuit is a circuit generating a clock signal, and the clock signal is supplied as an operation clock signal to an internal circuit through an operation clock signal generation circuit. The frequency of the clock signal from the oscillator circuit is variably controlled in response to the random number data stored in the frequency variable data register. A frequency variable range control register which stores control data for controlling the range of the frequency variably controlled in response to the random number data stored in the frequency variable data register is further provided.

5 Claims, 3 Drawing Sheets

SEMICONDUCTOR INTEGRATED CIRCUIT HAVING A RANDOM NUMBER AND OSCILLATOR CIRCUIT FOR VARIABLY CONTROLLING STORED DATA

CROSS-REFERENCE OF THE INVENTION

This application claims priority from Japanese Patent Application No. 2007-266859, the content of which is incorporated herein by reference in its entirety.

BACKGROUND OF THE INVENTION

1. Field of the Invention

The invention relates to a semiconductor integrated circuit having an oscillator circuit.

2. Description of the Related Art

In general, a tuner, an imaging system or the like needs a reference clock signal with a small frequency drift. In order to generate such a reference clock signal, a mechanical oscillator (a quartz crystal oscillator, a ceramic oscillator) with a high Q value and a small frequency drift is used.

On the other hand, the tuner, the imaging system or the like is controlled by a control LSI. An operation clock signal for operating an internal circuit is needed inside the control LSI. Such an operation clock signal is generated by an oscillator circuit inside the LSI, but it is known that it generates electromagnetic radiation noise (power supply noise, signal radiation noise).

A switching regulator circuit in which electromagnetic radiation noise due to switching noise is reduced is described in Japanese Patent Application Publication No. 2003-153526.

However, interference is likely to occur between the operation clock signal generated by the oscillator circuit and the reference clock signal generated by the tuner, the imaging system or the like, and the interference noise is likely to cause a problem for an application device such as the tuner, the imaging system or the like.

SUMMARY OF THE INVENTION

The invention provides a semiconductor integrated circuit that includes a random number generation circuit generating random number data, and an oscillator circuit generating a clock signal. The oscillation frequency of the clock signal is variably controlled in response to the random number data outputted by the random number generation circuit.

DETAILED DESCRIPTION OF THE INVENTION

Figure 1:
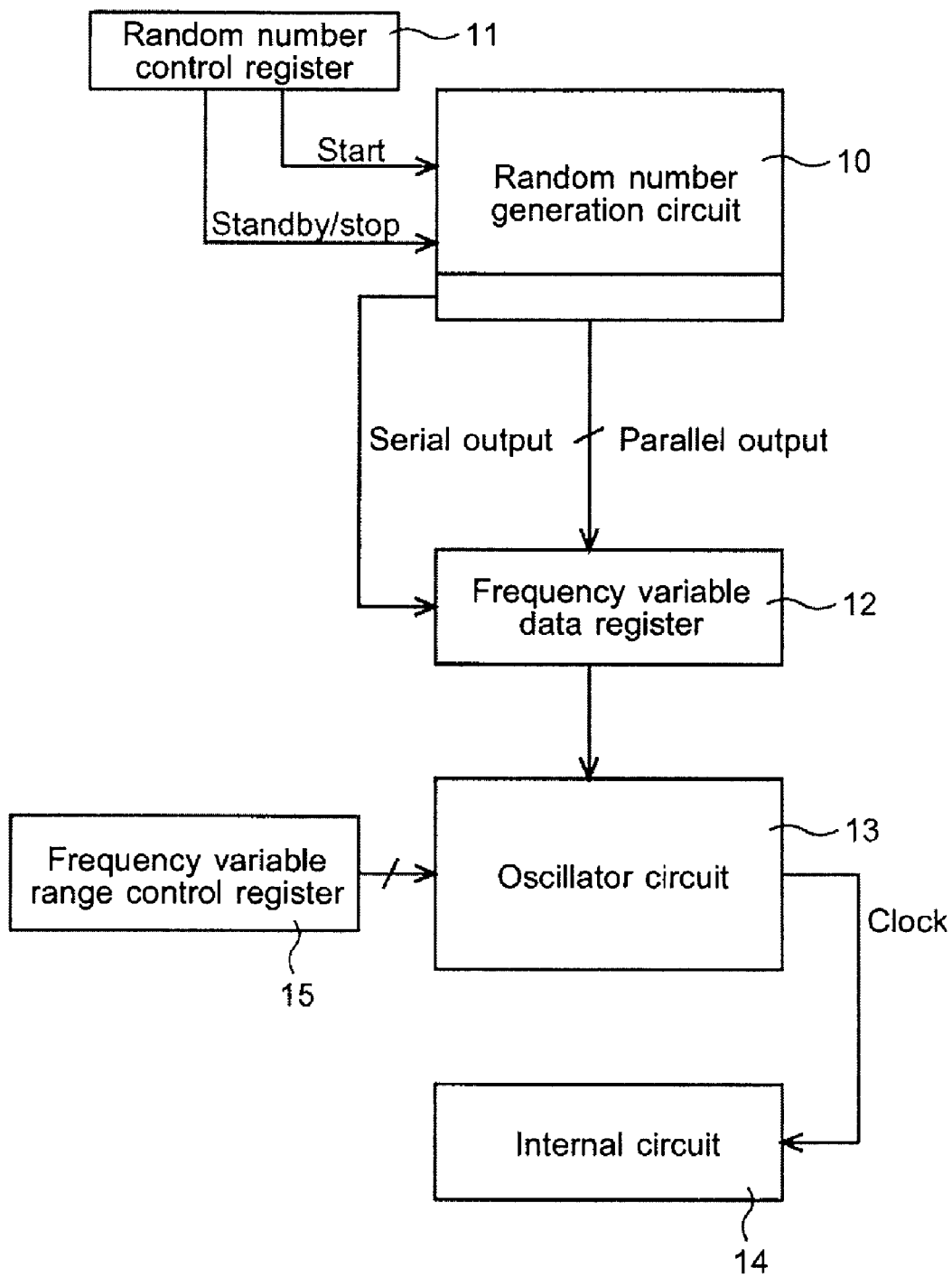
FIG. 1 is a diagram showing a structure of a semiconductor integrated circuit of a first embodiment of the invention.

A semiconductor integrated circuit of a first embodiment of the invention will be described referring to figures. FIG. 1 is a diagram showing the structure of the semiconductor integrated circuit of the first embodiment of the invention. Hereafter, descriptions will be given using a microcomputer as an example. A random number generation circuit 10 is a circuit sequentially generating n-bit random number data. A random number control register 11 is a register for controlling the start, standby, stop, timing or the like of the output of the random number data from the random number generation circuit.

The random number data is an n-bit data corresponding to a number randomly generated. As an example, 8-bit random number generation is explained. In this 8-bit scheme, 256 different numbers are generated, i.e., (00000000)-(11111111). These 256 numbers are randomly generated as 8-bit data.

The random number data outputted by the random number generation circuit 10 is stored in a frequency variable data register 12 (an example of a first control register of the invention). The data stored in the frequency variable data register 12 is replaced by random number data sequentially generated by the random number generation circuit 10.

It is noted that the random number data from the random number generation circuit 10 is stored in the frequency variable data register 12 as a serial output or a parallel output and these serial output and parallel output are arbitrarily selected.

An oscillator circuit 13 is a circuit generating a clock signal by oscillation, and the clock signal is supplied as an operation clock signal to an internal circuit 14 through an operation clock signal generation circuit (not shown). The frequency of the clock signal from the oscillator circuit 13 is variably controlled in response to the random number data stored in the frequency variable data register 12. A frequency variable range control register 15 (an example of a second control register of the invention) is further provided, which stores control data for controlling the range of the frequency variably controlled in response to the random number data stored in the frequency variable data register 12.

How the frequency of the clock signal generated by the oscillator circuit 13 is variably controlled in response to the random number data is explained. In the 8-bit random number data generation example explained above, the random number itself is not used. Rather, how many "1"s exist in the 8-bit random number data is determined. For example, there is no "1" in (00000000) and there are eight "1"s in (11111111). The occurrence of four "1"s are the most frequent, i.e., (01010101), (11110000) and the like. It is known that when the number of bit is large, for example 1000-bit random number data, the distribution of random number data sorted by the number of "1"s in the data becomes a normal distribution. It is desirable to use random number data of large bits so as to have a normal distribution.

Figure 2:
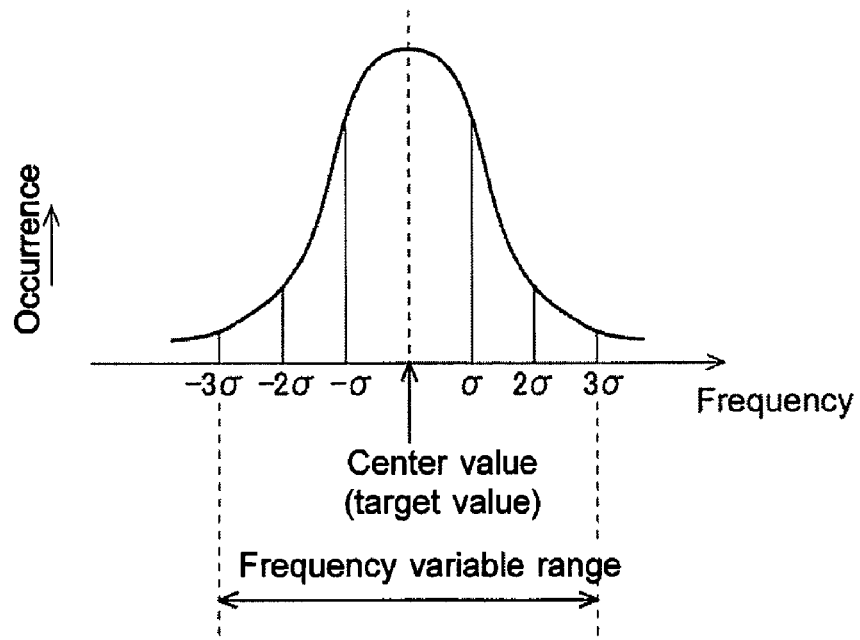
FIG. 2 is a graph showing a clock signal frequency distribution.

By using the number of "1"s in the random number data, and not the number itself, as the basis for generating the frequency of the clock signal, the generated frequencies have normal distribution, such as the one shown in FIG. 2. Specifically, in this embodiment, in the oscillator 13 shown in FIG. 3, current I is made proportional to the number of "1"s in the random number data by current control circuit 133. Furthermore, the frequency variable range control register 15, in this embodiment, stores the range of the normal distribution for the frequency generation. For example, when it has 2σ, the current control circuit uses only the 2σ distribution portion of the number distribution determined by the number of "1"s in the random number data. As a result, only the 2σ distribution portion of the frequencies of the clock signal is generated.

Figure 3:
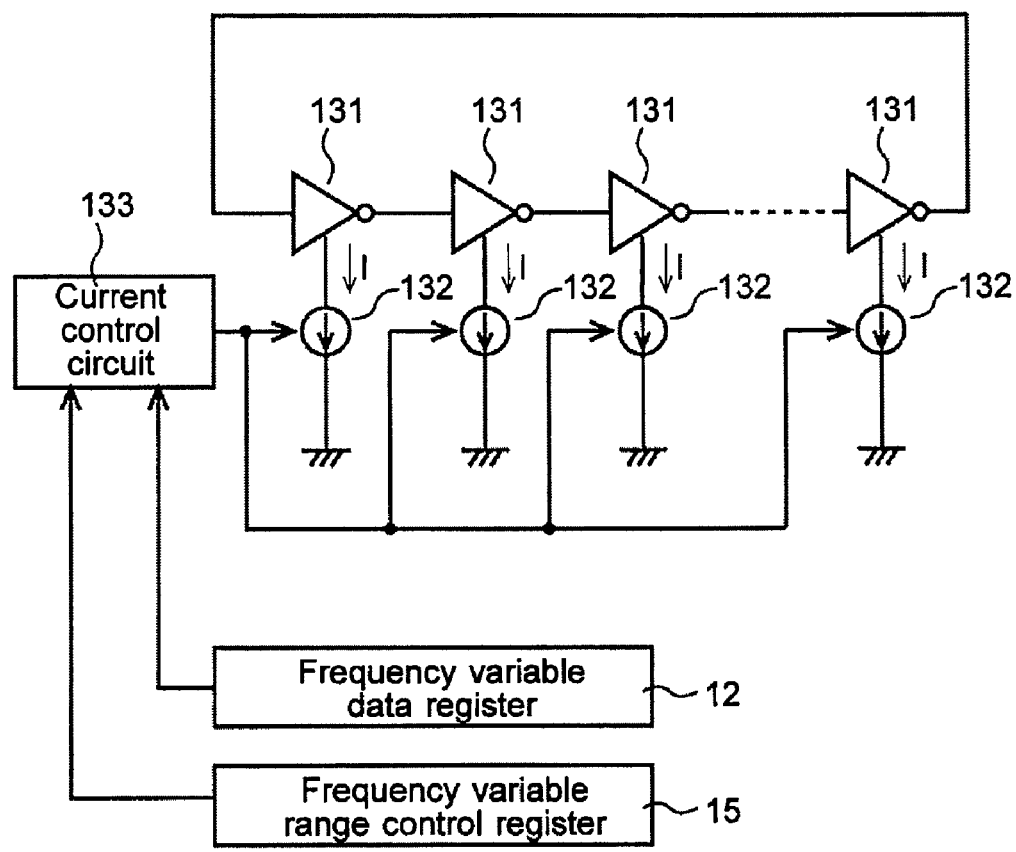
FIG. 3 is a circuit diagram of an oscillator circuit.

As an alternate embodiment, the current control circuit 133 can use the random number data itself, and not the number of "1"s in the data, to generate current I In FIG. 3. In this case, the distribution of the random number is flat, and thus the distribution of the frequency of the clock signal becomes flat. In the example of the 8-bit random number data, the value at the center of the number distribution is 128=(10000000), and the numbers are evenly distributed around the center value. As a result, the frequency distribution has the same distribution.

With the circuit structure described above, the frequency of the clock signal is variably controlled in response to the random number data and has a distribution. The state of the frequency distribution is adjusted by the random number data generated by the random number generation circuit 10. This causes the frequency of the operation clock signal of the semiconductor integrated circuit to drift temporally and reduces electromagnetic radiation noise. The range of the drift is determined by the control data of the frequency variable range control register 15. Furthermore, interference between a reference clock signal used for application of a tuner, an imaging system or the like and the operation clock signal is prevented.

The clock signal frequency distribution is preferably a normal distribution as shown in FIG. 2. In this case, the clock signal frequency is distributed relative to a center value (a target value), and its variable range (distribution range) is controlled by the frequency variable range control register 15. For example, the variable range is defined by 3 σ. It is noted that "σ" is a standard deviation of the normal distribution.

FIG. 3 is a circuit diagram showing the detailed structure of the oscillator circuit. This is a ring oscillator having an odd number of inverters 131, and a constant current source 132 providing an operation current for each of the inverters 131 is connected to each of the inverters 131.

A current control circuit 133 for controlling a current value I of a current to be generated by the constant current sources 132 is further provided. The current control circuit 133 controls the current value I based on the random number data stored in the frequency variable data register 12 and the control data stored in the frequency variable range control register 15.

The operation current of the inverters 131 increases when the current value I increases, and thus the oscillation frequency of the ring oscillator increases. The operation current of the inverters 131 decreases when the current value I decreases, and thus the oscillation frequency of the ring oscillator decreases. In this manner, the clock signal frequency is controlled by adjusting the current value I of the constant current sources 132.

Figure 4:
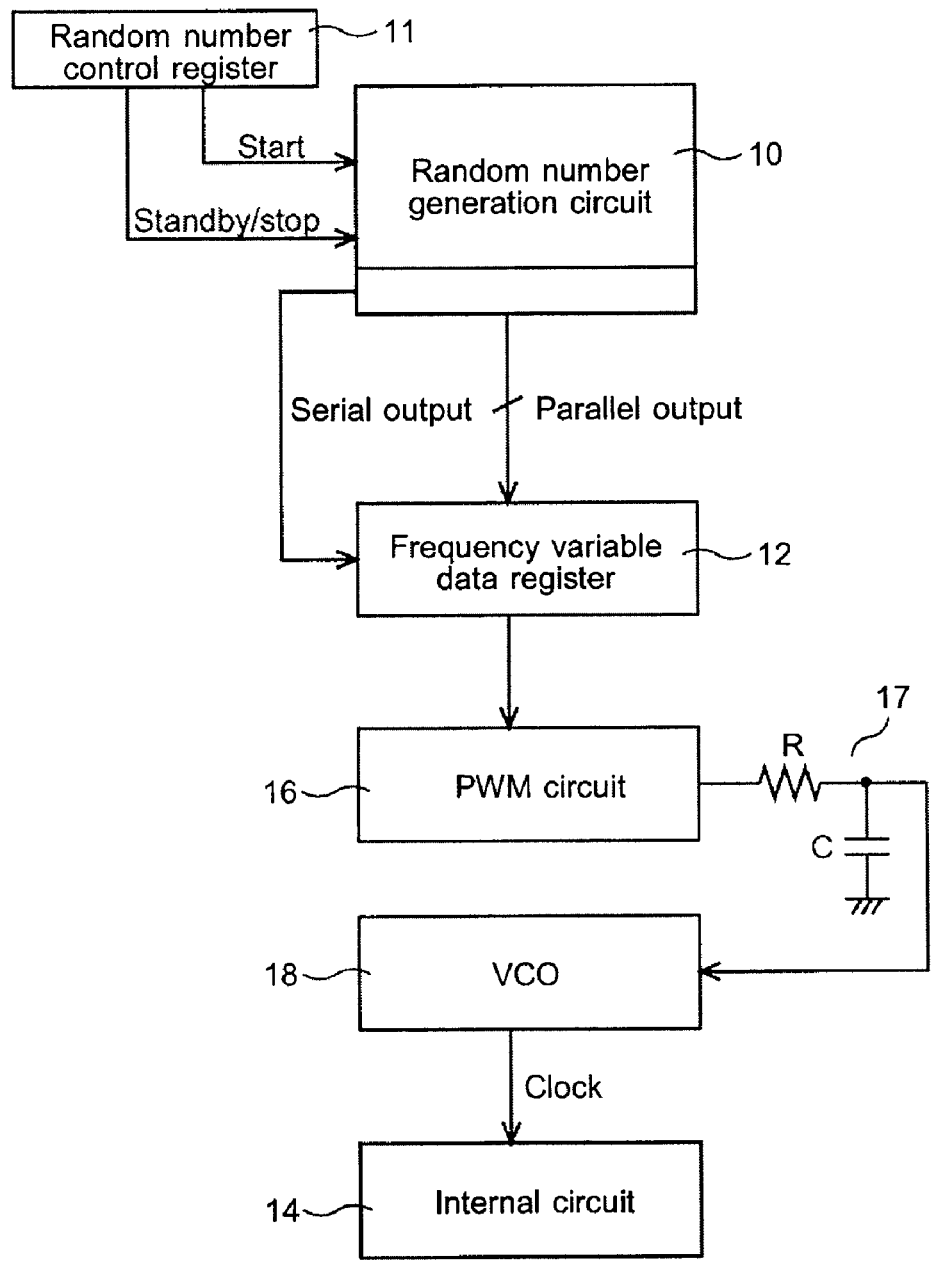
FIG. 4 is a diagram showing a structure of a semiconductor integrated circuit of a second embodiment of the invention.

A semiconductor integrated circuit of a second embodiment of the invention will be described referring to figures. FIG. 4 shows the structure of the semiconductor integrated circuit of the second embodiment of the invention. It is noted that the same numerals are given to the same components as those shown in FIG. 1 and the description thereof will be omitted. Random number data outputted by the random number generation circuit 10 is stored in the frequency variable data register 12.

Figure 5:
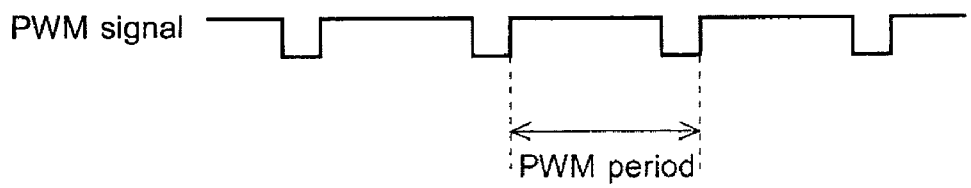
FIG. 5 is an operation waveform diagram of the semiconductor integrated circuit of the second embodiment of invention.

The random number data stored in the frequency variable data register 12 is converted into a PWM (pulse width modulation) signal as shown in FIG. 5 by a PWM circuit (a pulse range modulation circuit) 16. The PWM signal is a signal of which the duty ratio changes in response to the random number data. The duty ratio is a ratio of a H level period and a L level period of the PWM signal. For example, the duty ratio of the PWM signal increases according to the digital value of the random number data increases. The PWM signal is smoothed by a lowpass filter 17 formed of a resistor element R and a capacitor element C and converted into a direct current voltage. The PWM signal smoothed by the lowpass filter 17 is applied to a VCO (a voltage controlled oscillator circuit) 18. The VCO 18 generates a clock signal of which the oscillation frequency is variably controlled in response to the smoothed PWM signal. The clock signal generated by the VCO 18 is supplied as an operation clock signal to the internal circuit 14 through the operation clock signal generation circuit (not shown).

With the circuit structure described above, the frequency of the clock signal generated by the VCO 18 is variably controlled in response to the random number data and has a distribution. The state of the frequency distribution is adjusted by the random number data generated by the random number generation circuit 10. This causes the frequency of the operation clock signal of the semiconductor integrated circuit to drift temporally and reduces electromagnetic radiation noise in the same manner as the first embodiment.

Accordingly, the reduction of unnecessary electromagnetic radiation noise is achieved by drifting the frequency of the operation clock signal generated by the oscillator circuit. In particular, the interference between a reference clock signal used for application of a tuner, an imaging system or the like and an operation clock signal is prevented.

What is claimed is:

1. A semiconductor integrated circuit comprising:
   a random number generation circuit generating random number data;
   an oscillator circuit generating a clock signal; and
   a first control register storing the random number data outputted by the random number generation circuit,
   wherein the oscillation frequency of the clock signal is variably controlled in response to the random number data outputted by the random number generation circuit, and
   the oscillation frequency of the clock signal generated by the oscillator circuit is variably controlled in response to the random number data stored in the first control register.

2. The semiconductor integrated circuit of claim 1, further comprising a second control register storing control data for controlling a range of the oscillation frequency which is variably controlled in response to the random number data stored in the first control register.

3. The semiconductor integrated circuit of claim 1, wherein the oscillator circuit comprises a ring oscillator comprising a plurality of inverters, a constant current source provided for each of the inverters and supplying an operation current to a corresponding inverter, and a current control circuit controlling currents of the constant current sources based on the random number data stored in the first control register.

4. The semiconductor integrated circuit of claim 1, further comprising a pulse width modulation circuit generating a pulse width modulation signal in response to the random number data outputted by the random number generation circuit and a filter smoothing the pulse width modulation signal outputted by the pulse width modulation circuit, wherein the oscillator circuit is a voltage controlled oscillator circuit that controls the oscillation frequency of the clock signal in response to an output of the filter.

5. The semiconductor integrated circuit of claim 1 wherein the oscillator circuit uses the random number data so that the oscillation frequency forms a normal distribution.

* * * * *